(12) United States Patent
Iwashita et al.

(10) Patent No.: US 12,444,681 B2
(45) Date of Patent: Oct. 14, 2025

(54) SEMICONDUCTOR DEVICE AND METHOD FOR MANUFACTURING THE SAME

(71) Applicant: Kioxia Corporation, Tokyo (JP)

(72) Inventors: Yasunori Iwashita, Yokkaichi Mie (JP);
Shinya Arai, Yokkaichi Mie (JP);
Keisuke Nakatsuka, Kobe Hyogo (JP);
Hiroaki Ashidate, Mie Mie (JP)

(73) Assignee: KIOXIA CORPORATION, Tokyo (JP)

( * ) Notice: Subject to any disclaimer, the term of this patent is extended or adjusted under 35 U.S.C. 154(b) by 552 days.

(21) Appl. No.: 17/901,644

(22) Filed: Sep. 1, 2022

(65) Prior Publication Data

US 2023/0307361 A1 Sep. 28, 2023

(30) Foreign Application Priority Data

Mar. 22, 2022 (JP) ................. 2022-045836

(51) Int. Cl.
*H01L 23/528* (2006.01)
*H01L 23/00* (2006.01)
*H01L 23/522* (2006.01)
*H10B 41/20* (2023.01)
*H10B 43/20* (2023.01)

(52) U.S. Cl.
CPC ...... *H01L 23/5283* (2013.01); *H01L 23/5226* (2013.01); *H01L 24/80* (2013.01); *H10B 41/20* (2023.02); *H10B 43/20* (2023.02); *H01L 2224/8012* (2013.01); *H01L 2224/80123* (2013.01); *H01L 2224/80129* (2013.01)

(58) Field of Classification Search
CPC ............. H01L 24/80; H01L 2224/8012; H01L 2224/80123; H01L 2224/80129
See application file for complete search history.

(56) References Cited

U.S. PATENT DOCUMENTS 10,847,419 B2 * 11/2020 Miller .................. H01L 21/302
2013/0229638 A1 * 9/2013 Chen .................... G03F 9/7019
355/53

(Continued)

FOREIGN PATENT DOCUMENTS

CN 109920751 A 6/2019

*Primary Examiner* — David A Zarneke
(74) *Attorney, Agent, or Firm* — Foley & Lardner LLP

(57) ABSTRACT

A method of manufacturing a semiconductor device includes forming a first metal pad in each of a plurality of first regions on a first substrate so that warpage is generated on the first substrate. The method further includes forming a second metal pad in each of a plurality of second regions on a second substrate via a predetermined pattern. The method further includes bonding, after forming the first metal pad and the second metal pad, the first substrate with the second substrate. Moreover, the method further includes: making a correction, at a time of forming the predetermined pattern in each of the plurality of second regions on the second substrate, to change a position of the predetermined pattern in each of the plurality of second regions in a direction of being closer to a center of the second substrate for a first direction and to change the position of the predetermined pattern in a direction of being farther from the center of the second substrate for a second direction.

16 Claims, 12 Drawing Sheets

(56) References Cited

U.S. PATENT DOCUMENTS

| | | | |
|---|---|---|---|
| 2017/0069503 A1 | 3/2017 | Fujii et al. | |
| 2020/0381387 A1* | 12/2020 | Mitsuishi | H01L 24/94 |
| 2023/0197532 A1* | 6/2023 | Lei | H01L 25/50 |
| | | | 438/15 |
| 2023/0307396 A1* | 9/2023 | Iwashita | H01L 24/06 |
| 2024/0120312 A1* | 4/2024 | Ryan | H01L 24/05 |

* cited by examiner

SEMICONDUCTOR DEVICE AND METHOD FOR MANUFACTURING THE SAME

CROSS-REFERENCE TO RELATED APPLICATION(S)

This application is based upon and claims the benefit of priority from Japanese Patent Application No. 2022-045836, filed Mar. 22, 2022, the entire contents of which are incorporated herein by reference.

FIELD

Embodiments described herein relate generally to a semiconductor device and a method for manufacturing the same.

BACKGROUND

When a semiconductor device is manufactured by bonding substrates together, the substrates may not be able to be bonded appropriately due to warpage of at least any of the substrates.

DETAILED DESCRIPTION

At least one embodiment provides a semiconductor device and a method of manufacturing the same capable of appropriately bonding substrates together.

In general, according to at least one embodiment, a method of manufacturing a semiconductor device includes forming a first metal pad in each of a plurality of first regions on a first substrate so that a warpage is generated on the first substrate. The method further includes: forming a predetermined pattern in each of a plurality of second regions on a second substrate; and forming a second metal pad in each of the plurality of second regions on the second substrate in which the predetermined pattern is formed. The method further includes: bonding, after forming the first metal pad and the second metal pad, the first substrate with the second substrate so that a first surface on which the first metal pad is formed is opposed to a second surface on which the second metal pad is formed. Moreover, the method further includes: making a correction, at a time of forming the predetermined pattern in each of the plurality of second regions on the second substrate, to change a position of the predetermined pattern in each of the plurality of second regions in a direction of being closer to a center of the second substrate for a first direction and to change the position of the predetermined pattern in a direction of being farther from the center of the second substrate for a second direction.

Hereinafter, embodiments of the present disclosure will be described with reference to the drawings. In FIGS. 1 to 12B, the same elements are denoted by the same reference symbols, and repeated descriptions will be omitted.

First Embodiment

Figure 1:
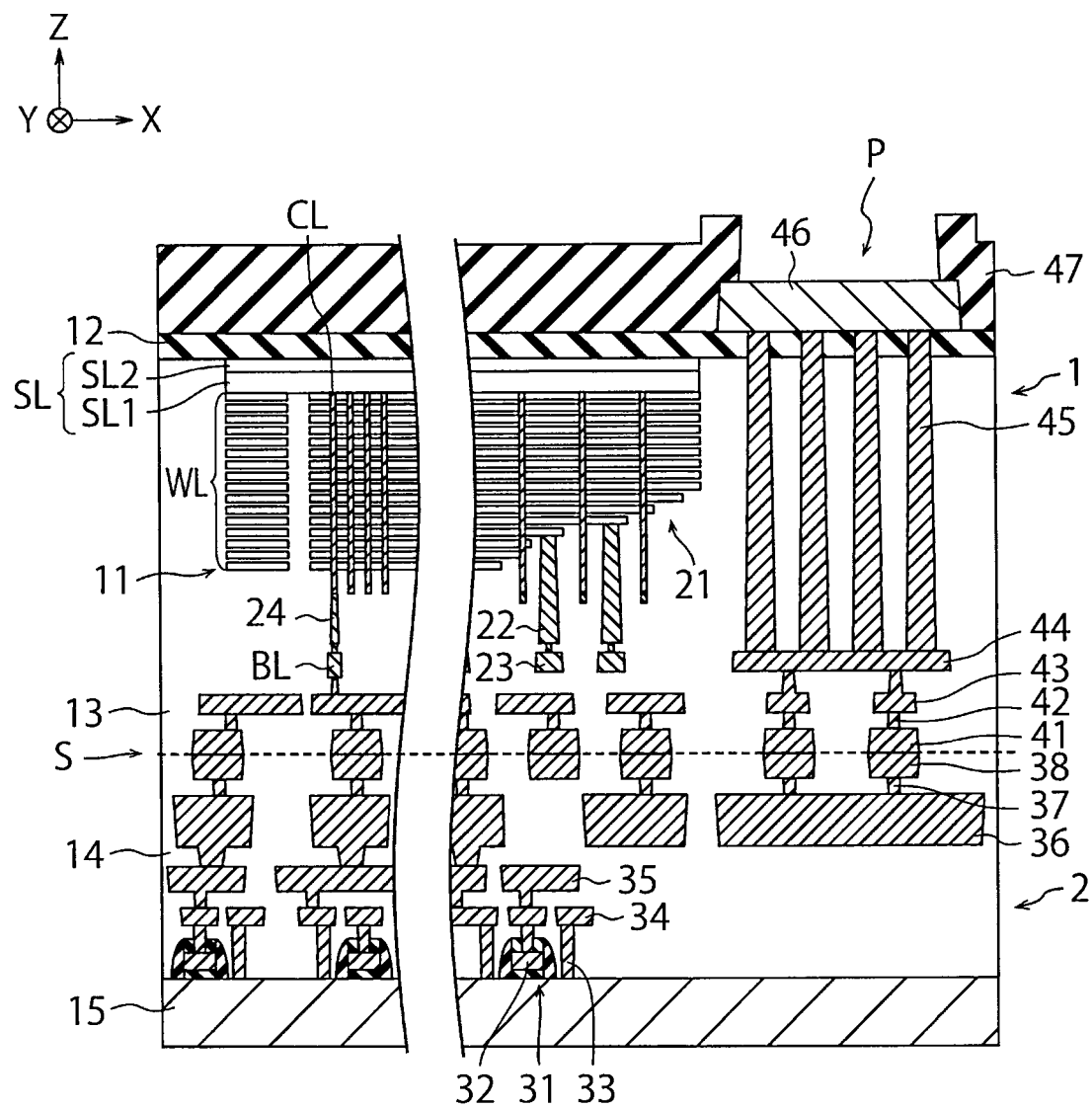
FIG. 1 is a cross-sectional view illustrating a structure of a semiconductor device according to a first embodiment.

FIG. 1 is a cross-sectional view illustrating a structure of a semiconductor device according to a first embodiment. The semiconductor device illustrated in FIG. 1 is, for example, a three-dimensional memory. The semiconductor device illustrated in FIG. 1 is manufactured by bonding an array wafer including an array region 1 with a circuit wafer including a circuit region 2, as will be described later.

The array region 1 includes a memory cell array 11 including a plurality of memory cells, an insulating film 12 above the memory cell array 11, and an interlayer insulating film 13 below the memory cell array 11. The insulating film 12 is, for example, a silicon oxide film ($SiO_2$ film) or a silicon nitride film (SiN film). The interlayer insulating film 13 is, for example, a silicon oxide film or a stacked film including a silicon oxide film and the other insulating film. The memory cell array 11, the insulating film 12, the interlayer insulating film 13, structures in the interlayer insulating film 13, and the like are an example of a first film.

The circuit region 2 is provided below the array region 1. Reference sign S indicates a boundary surface (bonding surface) between the array region 1 and the circuit region 2. The circuit region 2 includes an interlayer insulating film 14 and a substrate 15 below the interlayer insulating film 14. The interlayer insulating film 14 is, for example, a silicon oxide film or a stacked film including a silicon oxide film and the other insulating film. The substrate 15 is, for example, a semiconductor substrate such as a silicon (Si) substrate. The interlayer insulating film 14, structures in the interlayer insulating film 14, and the like are an example of a second film. The substrate 15 is an example of a second substrate.

FIG. 1 illustrates an X direction and a Y direction parallel to a surface of the substrate 15 and perpendicular to each other, and a Z direction perpendicular to the surface of the substrate 15. The X direction, the Y direction, and the Z direction intersect one another. In the present specification, a +Z direction is treated as an upward direction, and a −Z direction is treated as a downward direction. The −Z direction may or may not coincide with a gravitational direction.

The X direction is an example of a first direction, and the Y direction is an example of a second direction.

The array region 1 includes, as a plurality of electrode layers in the memory cell array 11, a plurality of word lines WL and a source line SL. FIG. 1 illustrates a staircase structure portion 21 of the memory cell array 11. Each word line WL is electrically connected to a word interconnection layer 23 via a contact plug 22. Each columnar portion CL penetrating the plurality of word lines WL is electrically connected to a bit line BL via a via plug 24 and is electrically connected to the source line SL. The source line SL includes a lower layer SL1 that is a semiconductor layer and an upper layer SL2 that is a metal layer.

The circuit region 2 includes a plurality of transistors 31. Each transistor 31 includes a gate electrode 32 provided on the substrate 15 via a gate insulating film, and a source diffusion layer and a drain diffusion layer, both of which are not illustrated, provided in the substrate 15. In addition, the circuit region 2 includes a plurality of contact plugs 33, each of which is provided on the gate electrode 32, the source diffusion layer, or the drain diffusion layer of the transistor 31, an interconnection layer 34 provided on these contact plugs 33 and including a plurality of interconnections, and an interconnection layer 35 provided on the interconnection layer 34 and including a plurality of interconnections.

The circuit region 2 further includes an interconnection layer 36 provided on the interconnection layer 35 and including a plurality of interconnections, a plurality of via plugs 37 provided on the interconnection layer 36, and a plurality of metal pads 38 provided on these via plugs 37. The metal pad 38 is a metal layer that includes, for example, a Cu (copper) layer. The circuit region 2 functions as a control circuit (logical circuit) that controls an operation of the array region 1. This control circuit is configured with the transistors 31 and the like, and is electrically connected to the metal pads 38. The metal pads 38 are an example of a second metal pad.

The array region 1 includes a plurality of metal pads 41 provided on the metal pads 38, and a plurality of via plugs 42 provided on the metal pads 41. Furthermore, the array region 1 includes an interconnection layer 43 provided on these via plugs 42 and including a plurality of interconnections, and an interconnection layer 44 provided on the interconnection layer 43 and including a plurality of interconnections. The metal pads 41 are metal layers that include, for example, a Cu layer. The bit line BL is provided in the interconnection layer 44. Moreover, the control circuit is electrically connected to the memory cell array 11 via the metal pads 41, 38, and the like and controls the operation of the memory cell array 11 via the metal pads 41, 38, and the like. The metal pads 41 are an example of a first metal pad.

The array region 1 further includes a plurality of via plugs 45 provided on the interconnection layer 44, a metal pad 46 provided on these via plugs 45 and the insulating film 12, and a passivation film 47 provided on the metal pad 46 and the insulating film 12. The metal pad 46 is a metal layer that includes, for example, a Cu layer, and functions as an external connection pad (bonding pad) of the semiconductor device of FIG. 1. The passivation film 47 is a stacked insulating film that includes, for example, a silicon oxide film and a silicon nitride film, and has an opening P that exposes an upper surface of the metal pad 46. The metal pad 46 can be connected to a mounting substrate or another device by a bonding wire, a solder ball, a metal bump, or the like via the opening P.

Figure 2:
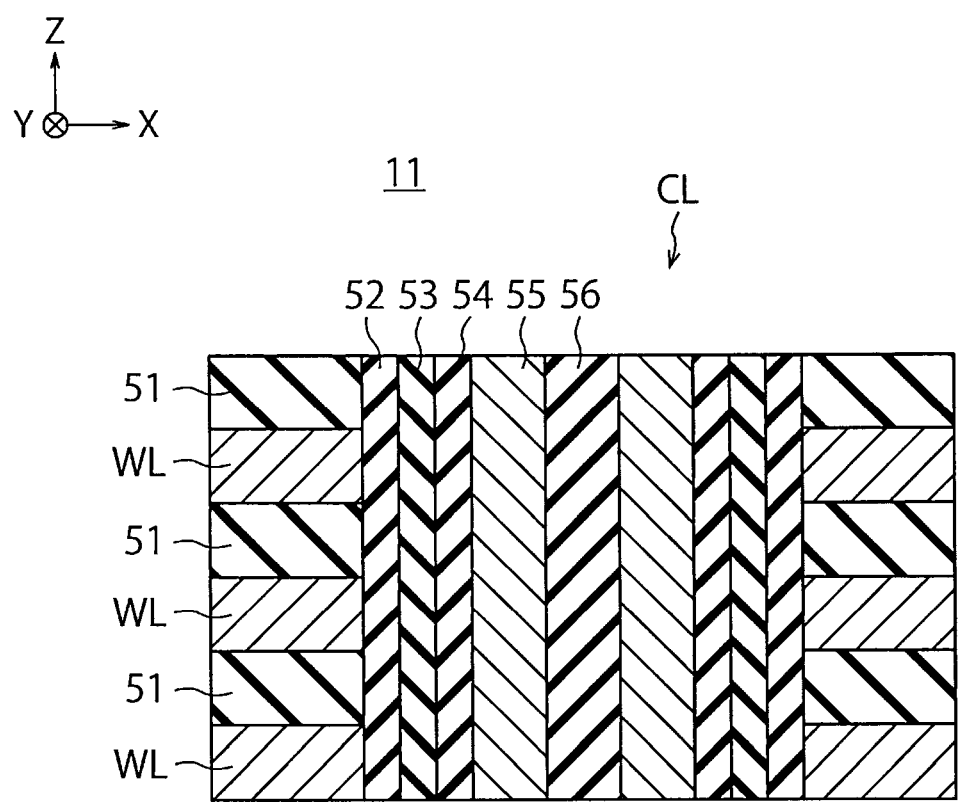
FIG. 2 is a cross-sectional view illustrating a structure of a columnar portion according to the first embodiment.

FIG. 2 is a cross-sectional view illustrating a structure of the columnar portion CL according to the first embodiment. FIG. 2 illustrates one of a plurality of columnar portions CL illustrated in FIG. 1.

As illustrated in FIG. 2, the memory cell array 11 includes the plurality of word lines WL and a plurality of insulating layers 51 that are alternately stacked on the interlayer insulating film 13 (refer to FIG. 1). The word lines WL may be metal layers each including, for example, a W (tungsten) layer. The insulating layers 51 are, for example, silicon oxide films.

The columnar portion CL includes a block insulating film 52, a charge storage layer 53, a tunnel insulating film 54, a channel semiconductor layer 55, and a core insulating film 56 in sequence. The charge storage layer 53 is, for example, an insulating film such as a silicon nitride film, and is formed on side surfaces of the word lines WL and the insulating layers 51 via the block insulating film 52. The charge storage layer 53 may be a semiconductor layer such as a polysilicon layer. The channel semiconductor layer 55 is, for example, a polysilicon layer, and is formed on a side surface of the charge storage layer 53 via the tunnel insulating film 54. The block insulating film 52, the tunnel insulating film 54, and the core insulating film 56 are, for example, silicon oxide films or metal insulating films.

Figure 3:
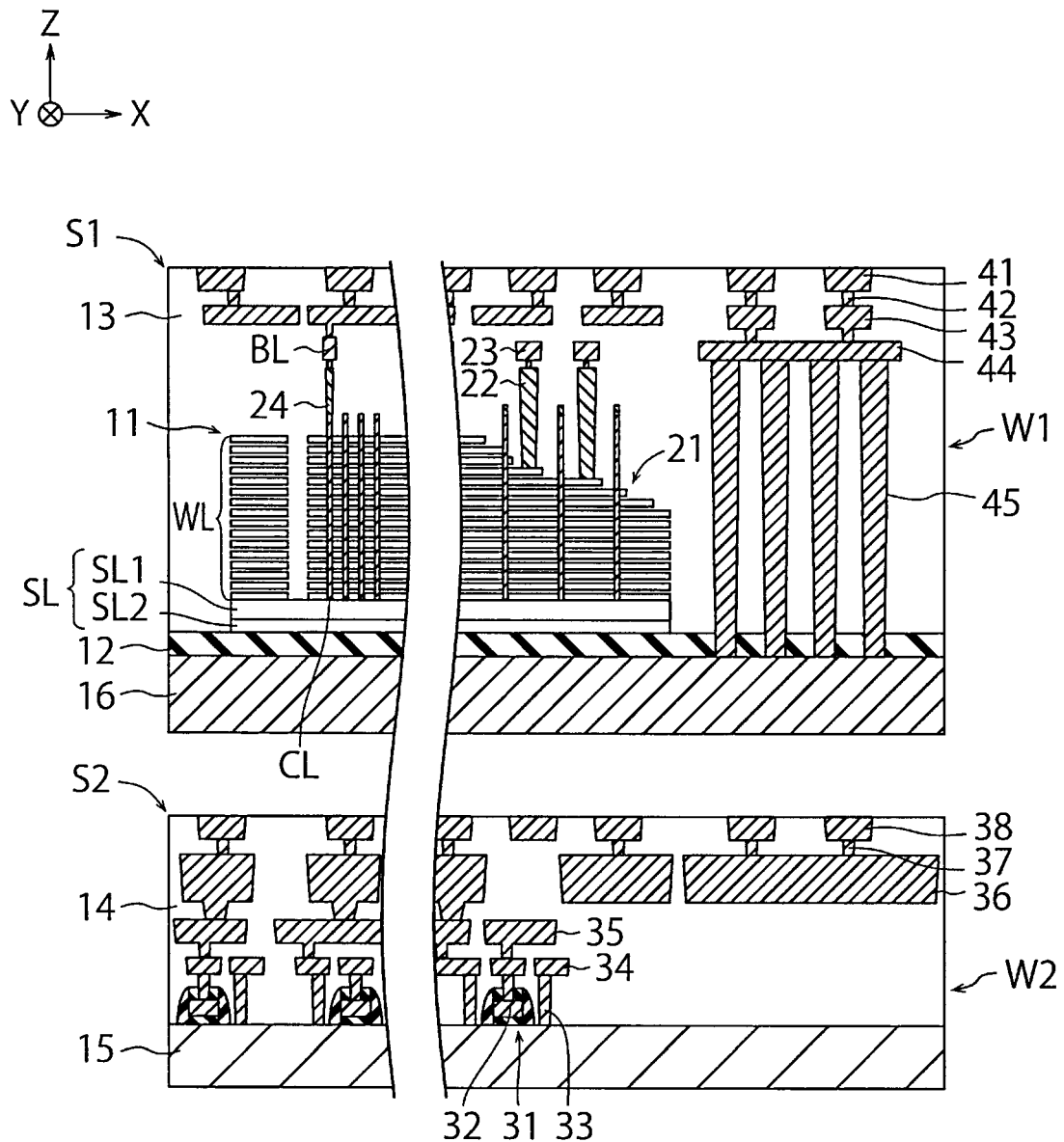
FIG. 3 is a cross-sectional view (1/2) illustrating a method for manufacturing the semiconductor device according to the first embodiment.
Figure 4:
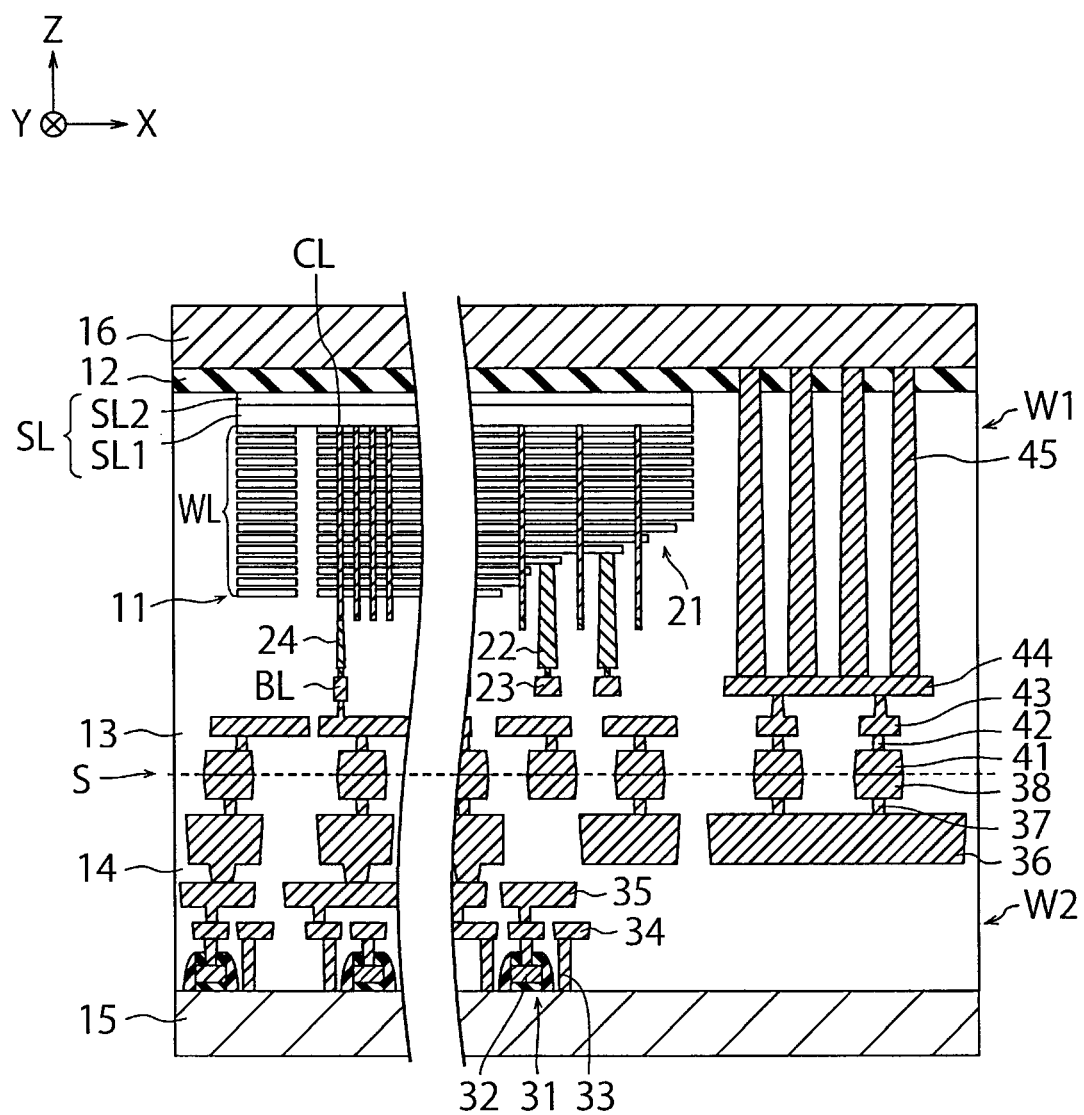
FIG. 4 is a cross-sectional view (2/2) illustrating the method for manufacturing the semiconductor device according to the first embodiment.

FIGS. 3 and 4 are cross-sectional views illustrating a method of manufacturing the semiconductor device according to the first embodiment.

FIG. 3 illustrates an array wafer W1 including a plurality of the array regions 1 and a circuit wafer W2 including a plurality of the circuit regions 2. An orientation of the array wafer W1 in FIG. 3 is reversed with respect to an orientation of the array region 1 in FIG. 1. In at least one embodiment, the semiconductor device is manufactured by bonding the array wafer W1 with the circuit wafer W2. FIG. 3 illustrates the array wafer W1 before the orientation is reversed for bonding, while FIG. 1 illustrates the array region 1 after the orientation is reversed for bonding and bonding and dicing are performed.

In FIG. 3, reference sign S1 indicates an upper surface of the array wafer W1, and a reference sign S2 indicates an upper surface of the circuit wafer W2. The array wafer W1 includes a substrate 16 provided under the insulating film 12. The substrate 16 is, for example, a semiconductor substrate such as a silicon substrate. The substrate 16 is an example of a first substrate.

In at least one embodiment, first, as illustrated in FIG. 3, the memory cell arrays 11, the insulating film 12, the interlayer insulating film 13, the staircase structure portions 21, the metal pads 41, and the like are formed on the substrate 16 of the array wafer W1, and the interlayer insulating film 14, the transistors 31, the metal pads 38, and the like are formed on the substrate 15 of the circuit wafer W2. For example, the via plugs 45, the interconnection layer 44, the interconnection layer 43, the via plugs 42, and the metal pads 41 are formed on the substrate 16 in sequence. In addition, the contact plugs 33, the interconnection layer 34, the interconnection layer 35, the interconnection layer 36, the via plugs 37, and the metal pads 38 are formed on the substrate 15 in sequence. Next, as illustrated in FIG. 4, the array wafer W1 and the circuit wafer W2 are bonded with each other by a mechanical pressure so that the surface S1 is opposed to the surface S2. The interlayer insulating film 13 and the interlayer insulating film 14 are thereby made to adhere to each other. Next, the array wafer W1 and the circuit wafer W2 are annealed. The metal pads 41 and the metal pads 38 are bonded with each other. In this way, the substrates 16 and 15 are bonded with each other via the interlayer insulating films 13 and 14.

Subsequently, the substrate 15 is thinned by CMP (Chemical Mechanical Polishing), the substrate 16 is removed by the CMP, and then the array wafer W1 and the circuit wafer W2 are diced into a plurality of chips. In this way, the semiconductor device in FIG. 1 is manufactured. The metal pad 46 and the passivation film 47 are formed on the insulating film 12, for example, after the substrate 15 is thinned and the substrate 16 is removed.

In at least one embodiment, the array wafer W1 and the circuit wafer W2 are bonded with each other; alternatively, the array wafers W1 may be bonded with each other. The contents described above with reference to FIGS. 1 to 4 and contents to be described later with reference to FIGS. 5A to 12B are applicable also to the bonding of the array wafers W1 together.

Furthermore, FIG. 1 illustrates a boundary surface between the interlayer insulating films 13 and 14 and a boundary surface between the metal pads 41 and 38. These boundary surfaces are normally not observable after the above-described annealing. Nevertheless, positions of these boundary surfaces can be estimated by detecting, for example, inclinations of side surfaces of the metal pads 41 or side surfaces of the metal pads 38, or positional deviations between the side surfaces of the metal pads 41 and the side surfaces of the metal pads 38.

Furthermore, the semiconductor device according to at least one embodiment may be subjected to trading in a state of FIG. 1 after dicing into the plurality of chips, or may be subjected to trading in a state of FIG. 4 before dicing into the plurality of chips. FIG. 1 illustrates the semiconductor device in a state of a chip while FIG. 4 illustrates the semiconductor device in a state of a wafer. In at least one embodiment, a plurality of semiconductor devices in a state of chips (FIG. 1) are manufactured from one semiconductor device in the state of a wafer (FIG. 4).

Next, three examples of a method of bonding (bonding method for) the array wafer W1 with the circuit wafer W2 in at least one embodiment will be described with reference to FIGS. 5A to 8C.

Figure 5A:
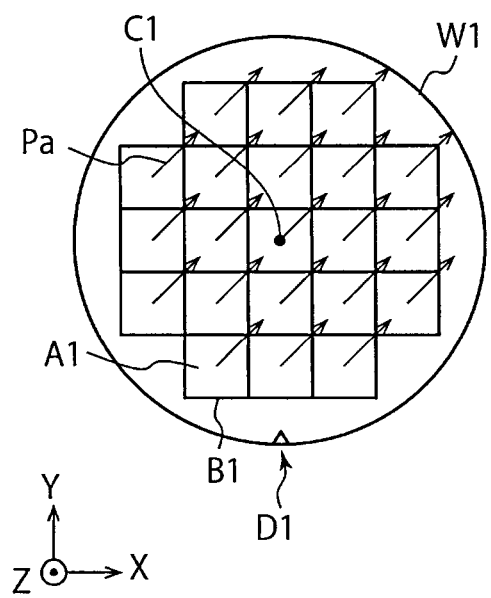
FIGS. 5A to 5C are a plan view, a plan view, and a perspective view, respectively illustrating a first example of a bonding method according to the first embodiment.
Figure 5B:
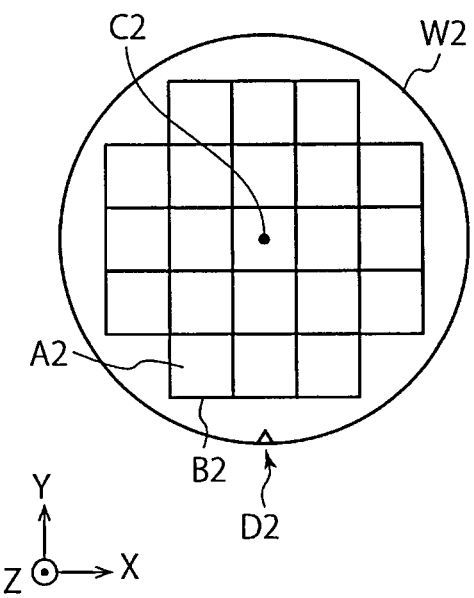
Figure 5C:
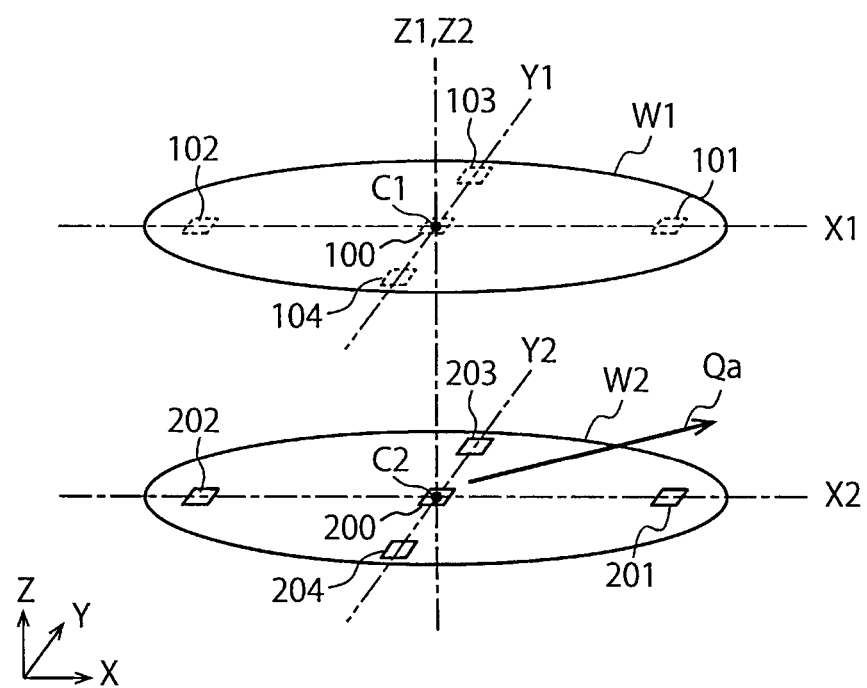

FIGS. 5A to 5C are a plan view, a plan view, and a perspective view illustrating a first example of the bonding method according to the first embodiment, respectively.

FIG. 5A illustrates the array wafer W1 just before bonding. The array wafer W1 includes a plurality of chip regions A1 and scribe regions B1 provided between these chip regions A1. Each chip region A1 corresponds to one array region 1. Each of the scribe regions B1 is of a shape that is a combination of a plurality of lines extending in the X direction and a plurality of lines extending in the Y direction. FIG. 5A also illustrates a center C1 of the array wafer W1 and a notch D1 of the array wafer W1. In FIG. 5A, the notch D1 is located in the −Y direction of the center C1.

FIG. 5B illustrates the circuit wafer W2 just before bonding. The circuit wafer W2 also includes a plurality of chip regions A2 and scribe regions B2 provided between these chip regions A2. Each chip region A2 corresponds to one circuit region 2. Each of the scribe regions B2 is of a shape that is a combination of a plurality of lines extending in the X direction and a plurality of lines extending in the Y direction. FIG. 5B also illustrates a center C2 of the circuit wafer W2 and a notch D2 of the circuit wafer W2. In FIG. 5B, the notch D2 is located in the −Y direction of the center C2.

Arrows Pa illustrated in FIG. 5A each indicate a deviation between a designed position of each of various structures in the array wafer W1 and an actual position thereof. FIG. 5A illustrates that actual positions of these structures are shifted upper right with respect to the designed positions of these structures. Examples of these structures include memory cells in the memory cell array 11, the metal pads 41, and the via plugs 45 (refer to FIG. 3 and the like). These positional deviations may occur when, for example, there is some problem with a semiconductor manufacturing device.

FIG. 5C illustrates a state of bonding the array wafer W1 with the circuit wafer W2, similarly to FIG. 4. Lines X1, Y1, and Z1 pass through the center C1 of the array wafer W1 and extend in the X, Y, and Z directions, respectively. Lines X2, Y2, and Z2 pass through the center C2 of the circuit wafer W2 and extend in the X, Y, and Z directions, respectively. The notch D1, not illustrated, of the array wafer W1 is located in the −Y direction of the center C1, while the notch D2, not illustrated, of the circuit wafer W2 is located in the −Y direction of the center C2.

FIG. 5C also illustrates regions 100 to 104 on a surface (lower surface) of the array wafer W1 and regions 200 to 204 on a surface (an upper surface) of the circuit wafer W2. The region 100 is located at the center C1, and the regions 101, 102, 103, and 104 are located in the +X direction, the −X direction, the +Y direction, and the −Y direction of the region 100, respectively. Likewise, the region 200 is located at the center C2, and the regions 201, 202, 203, and 204 are located in the +X direction, the −X direction, the +Y direction, and the −Y direction of the region 200, respectively. It is noted that distances between the region 100 and the regions 101 to 104 and distances between the region 200 and the regions 201 to 204 are all equal. Each of the regions 100 to 104 includes one or more metal pads 41 and each of the regions 200 to 204 includes one or more metal pads 38. The regions 100 to 104 are an example of a first region, while the regions 200 to 204 are an example of a second region.

Normally, the array wafer W1 and the circuit wafer W2 are bonded together so that the regions 100 to 104 overlap the regions 200 to 204, respectively. In the array wafer W1 in this example, however, positional deviations are generated as illustrated in FIG. 5A. Owing to this, at a time of bonding the array wafer W1 and the circuit wafer W2 in this example together, a position of the circuit wafer W2 is translated in a direction indicated by an arrow Qa. It is thereby possible to bond the array wafer W1 and the circuit wafer W2 together so that the metal pads 41 adjoin the metal pads 38 (refer to FIG. 4 and the like). Such a translational correction can be achieved by translating the circuit wafer W2 in the semiconductor manufacturing device.

Figure 6A:
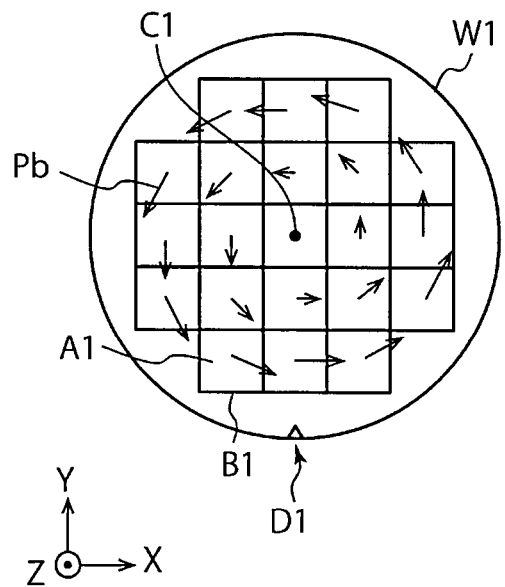
FIGS. 6A to 6C are a plan view, a plan view, and a perspective view, respectively illustrating a second example of the bonding method according to the first embodiment.
Figure 6B:
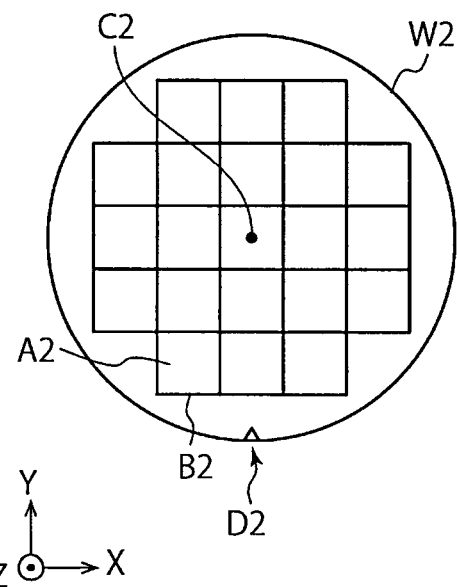
Figure 6C:
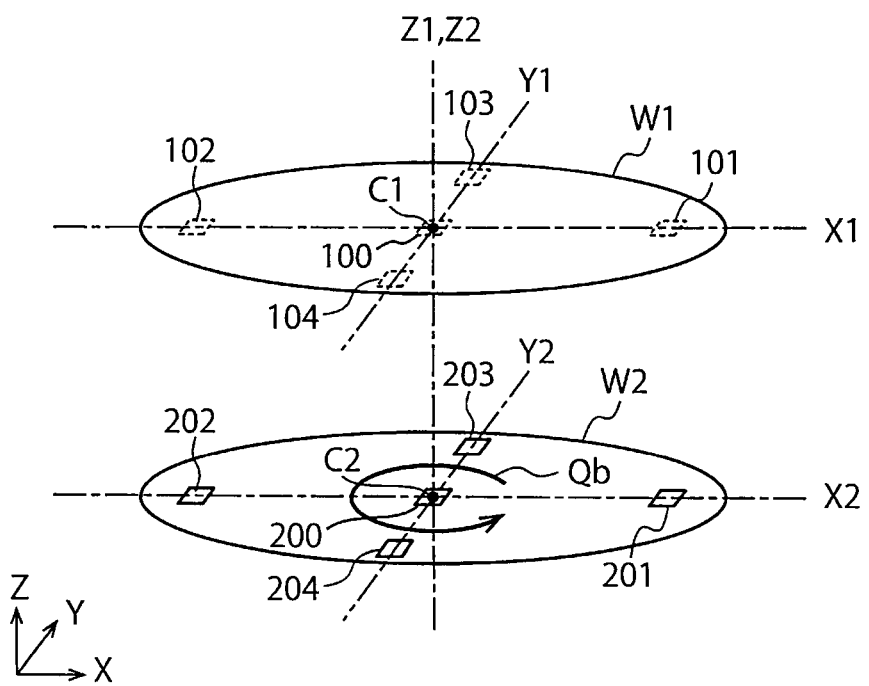

FIGS. 6A to 6C are a plan view, a plan view, and a perspective view, respectively, illustrating a second example of the bonding method according to the first embodiment, respectively.

FIGS. 6A and 6B illustrate the array wafer W1 and the circuit wafer W2 just before bonding, respectively. Arrows Pb illustrated in FIG. 6A each indicate a deviation between the designed position of each of the various structures in the array wafer W1 and the actual position thereof. FIG. 6A illustrates that actual positions of these structures are moved counterclockwise with respect to the designed positions of these structures. These positional deviations may occur when, for example, there is some problem with a semiconductor manufacturing device.

FIG. 6C illustrates a state of bonding the array wafer W1 with the circuit wafer W2, similarly to FIG. 4. In the array wafer W1 in this example, positional deviations are generated as illustrated in FIG. 6A. Owing to this, at the time of bonding the array wafer W1 and the circuit wafer W2 in this example together, the position of the circuit wafer W2 is rotated in a direction indicated by an arrow Qb. It is thereby possible to bond the array wafer W1 and the circuit wafer W2 together so that the metal pads 41 adjoin the metal pads 38. Such a rotational correction can be achieved by rotating the circuit wafer W2 in the semiconductor manufacturing device.

Figure 7A:
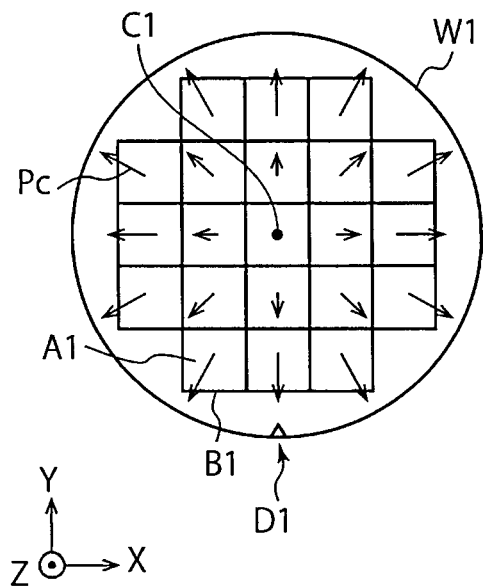
FIGS. 7A to 7C are a plan view, a plan view, and a perspective view, respectively illustrating a third example of the bonding method according to the first embodiment.
Figure 7B:
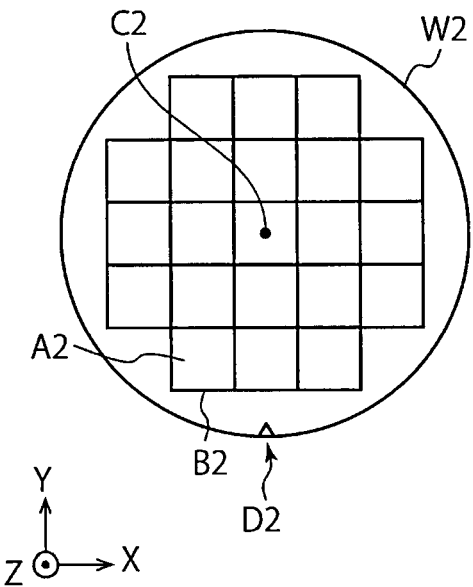
Figure 7C:
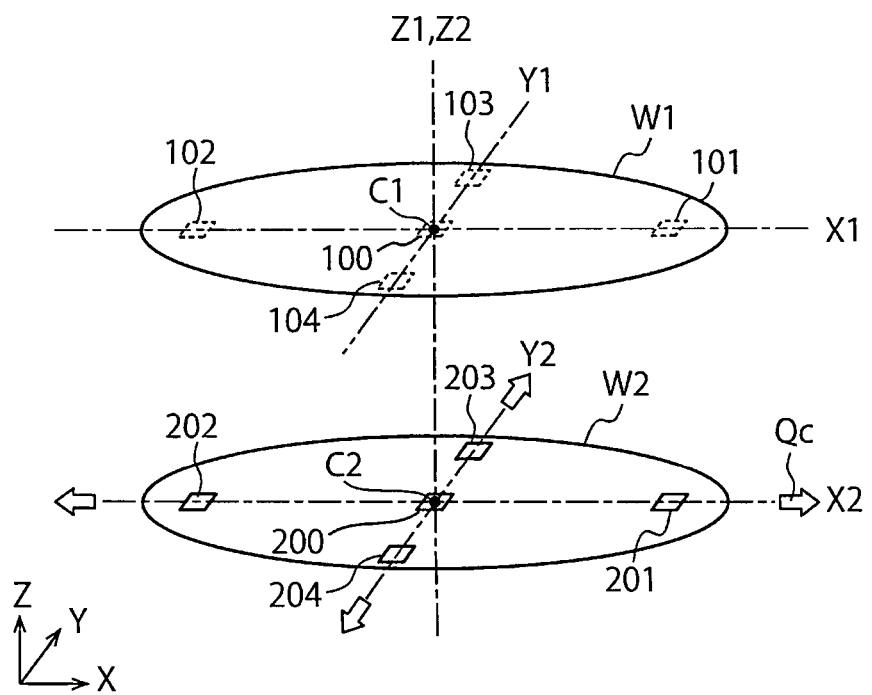

FIGS. 7A to 7C are a plan view, a plan view, and a perspective view illustrating a third example of the bonding method according to the first embodiment, respectively.

FIGS. 7A and 7B illustrate the array wafer W1 and the circuit wafer W2 just before bonding, respectively. Arrows Pc illustrated in FIG. 7A each indicate a deviation between the designed position of each of the various structures in the array wafer W1 and the actual position thereof. FIG. 7A illustrates that actual positions of these structures are moved in a direction of being farther from the center C1 with respect to the designed positions of these structures. This signifies that the actual structures are made larger than the designed structures. These positional deviations may occur when, for example, there is some problem with a lithographic exposure process.

FIG. 7C illustrates a state of bonding the array wafer W1 with the circuit wafer W2, similarly to FIG. 4. In the array wafer W1 in this example, positional deviations are generated as illustrated in FIG. 7A. Owing to this, at a time of manufacturing the circuit wafer W2 in this example, the various structures in the circuit wafer W2 are formed larger as indicated by an arrow Qc. Examples of these structures include the gate electrodes 32 of the transistors 31, the contact plugs 33, and the metal pads 38 (refer to FIG. 3 and the like). The circuit wafer W2 manufactured in this way is then bonded to the array wafer W1. It is thereby possible to bond the array wafer W1 and the circuit wafer W2 together so that the metal pads 41 adjoin the metal pads 38. Such an enlargement correction can be achieved by changing an exposure magnification in the exposure process at the time of manufacturing the circuit wafer W2.

The translational correction in the first example and the rotational correction in the second example are performed when the array wafer W1 and the circuit wafer W2 are bonded together after manufacturing the circuit wafer W2. Meanwhile, the enlargement correction in the third example is performed at the time of manufacturing the circuit wafer W2.

Figure 8A:
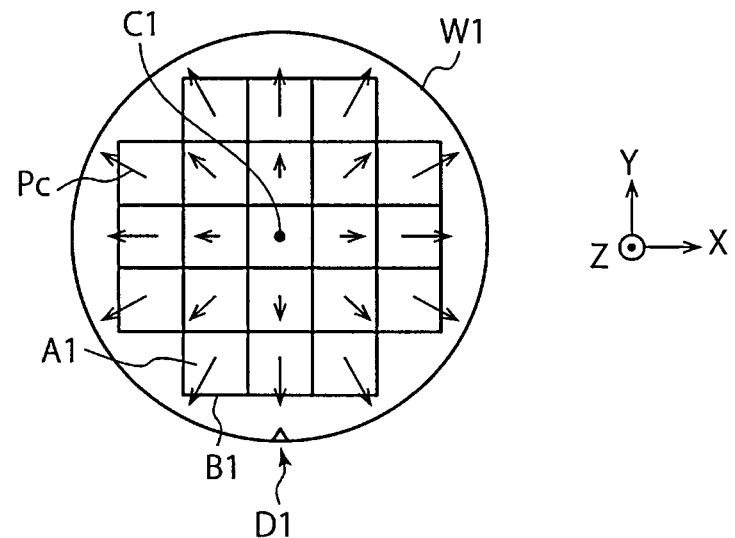
FIGS. 8A to 8C are plan views illustrating a modification of the third example of the bonding method according to the first embodiment.
Figure 8B:
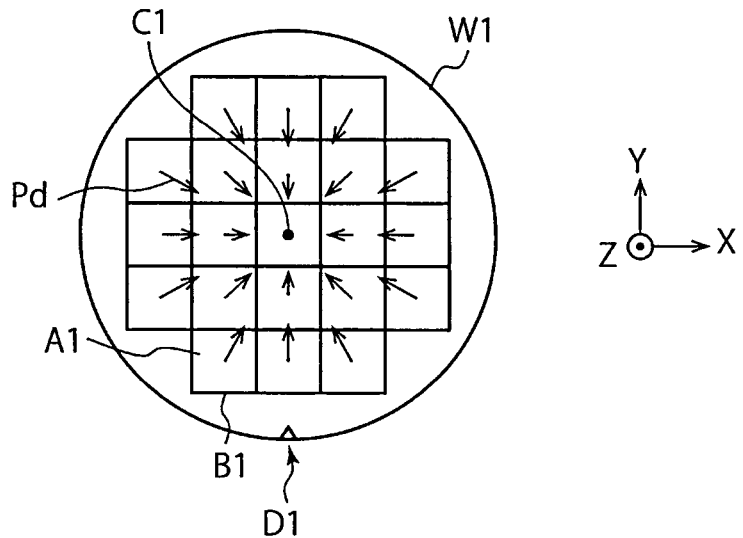
Figure 8C:
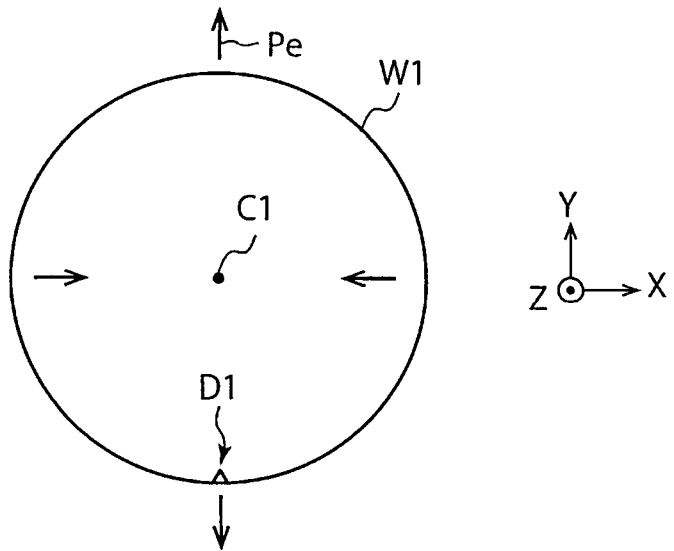

FIGS. 8A to 8C are plan views illustrating a modification of the third example of the bonding method according to the first embodiment.

FIG. 8A illustrates the array wafer W1 just before bonding. The array wafer W1 illustrated in FIG. 8A is the same as the array wafer W1 illustrated in FIG. 7A. Therefore, the arrows Pc illustrated in FIG. 8A each indicate the deviation between the designed position of each of the various structures in the array wafer W1 and the actual position thereof.

Similarly to FIG. 8A, FIG. 8B illustrates the array wafer W1 just before bonding. Arrows Pd illustrated in FIG. 8B each indicate a deviation between the designed position of each of the various structures in the array wafer W1 and the actual position thereof. FIG. 8B illustrates that actual positions of these structures are moved in a direction of being closer to the center C1 with respect to the designed positions of these structures. This signifies that the actual structures are made smaller than the designed structures. These positional deviations may occur when, for example, there is some problem with a lithographic exposure process. In this case, a reduction correction is performed on the structures in the circuit wafer W2 as an alternative to the enlargement correction on the structures in the circuit wafer W2. It is thereby possible to bond the array wafer W1 and the circuit wafer W2 together so that the metal pads 41 adjoin the metal pads 38.

FIG. 8C also illustrates the array wafer W1 just before bonding. Arrows Pe illustrated in FIG. 8C each indicate a deviation between the designed position of each of the various structures in the array wafer W1 and the actual position thereof. FIG. 8C illustrates that actual positions of these structures are moved in the direction of being closer to the center C1 or in the direction of being farther from the center C1 with the respect to the designed positions of these structures. For example, as for the position along the X direction, the actual position is moved in the direction of being closer to the center C1 with respect to the designed position. Meanwhile, as for the position along the Y direction, the actual position is moved in the direction of being farther from the center C1 with respect to the designed position. These positional deviations may occur when, for example, the array wafer W1 has warpage. Positional corrections of the structures in the circuit wafer W2 in this case will be described later.

Figure 9:
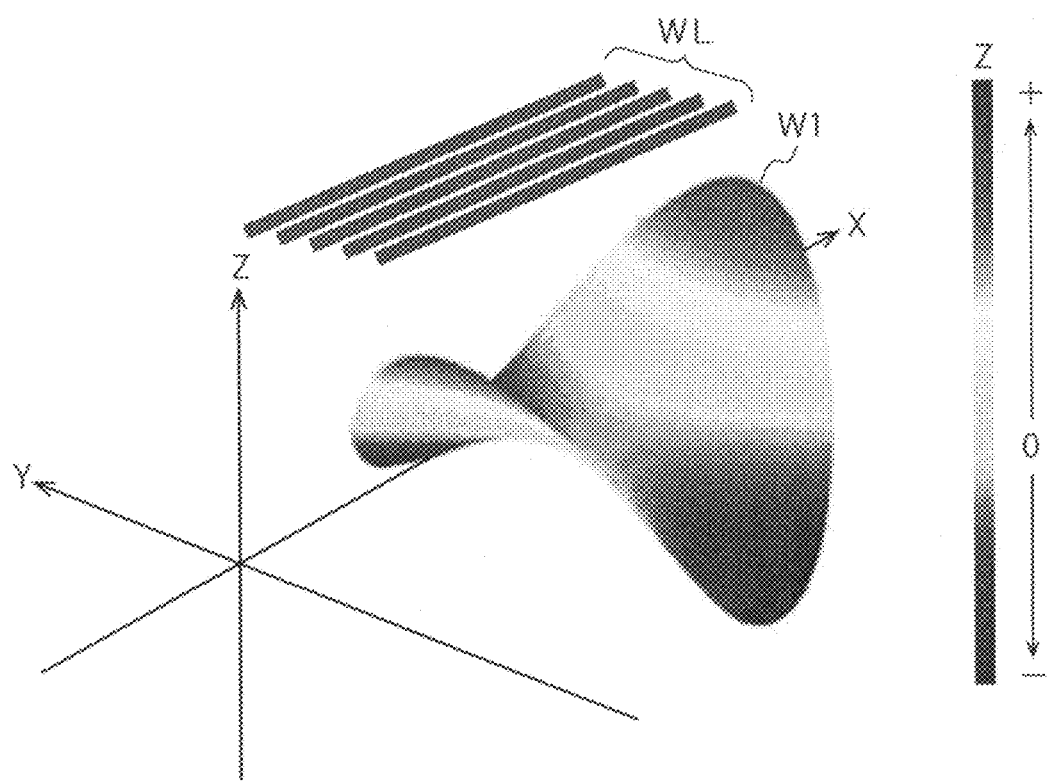
FIG. 9 is a perspective view schematically illustrating warpage generated on an array wafer according to the first embodiment.

FIG. 9 is a perspective view schematically illustrating the warpage generated in the array wafer W1 according to the first embodiment.

In at least one embodiment, when the memory cell array 11, the insulating film 12, the interlayer insulating film 13, and the like are formed on the substrate 16 as illustrated in FIG. 3, warpage is generated in the substrate 16 due to an influence of the memory cell array 11, the insulating film 12, the interlayer insulating film 13, and the like. As a result, the array wafer W1 warps as illustrated in FIG. 9. In FIG. 9, the warpage generated in the array wafer W1 is illustrated larger than actual warpage to make the drawing easier to view.

In FIG. 9, the warpage of the array wafer W1 (substrate 16) is generated so that a direction of the warpage in a cross-section along the X direction is opposite to a direction of the warpage in the cross-section along the Y direction. For example, in an XZ cross-section passing through the center C1 (refer to FIG. 8C and the like) of the array wafer W1, the array wafer W1 in FIG. 9 warps into a shape that is convex downward. Meanwhile, in a YZ cross-section passing through the center C1 of the array wafer W1, the array wafer W1 in FIG. 9 warps into a shape that is convex upward. Therefore, the warpage of the array wafer W1 in FIG. 9 is generated so that the direction of the warpage in the XZ cross-section is opposite to the direction of the warpage in the YZ cross-section.

Such warpage of the array wafer W1 is generated due to, for example, an influence of the word lines WL. FIG. 9 schematically illustrates the word lines WL extending in the X direction, similarly to FIG. 3. The word lines WL are metal layers each including, for example, a W (tungsten) layer. A shape of each word line WL has large anisotropy between the X direction and the Y direction and, therefore, causes the warpage of the array wafer W1.

Figure 10A:
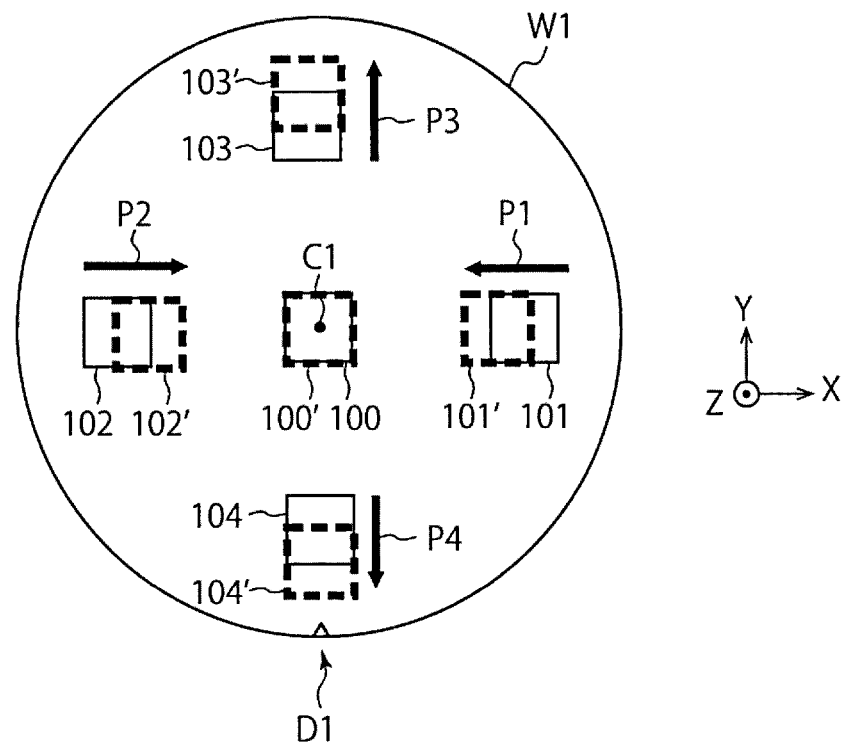
FIGS. 10A and 10B are plan views illustrating details of the bonding method according to the first embodiment.
Figure 10B:
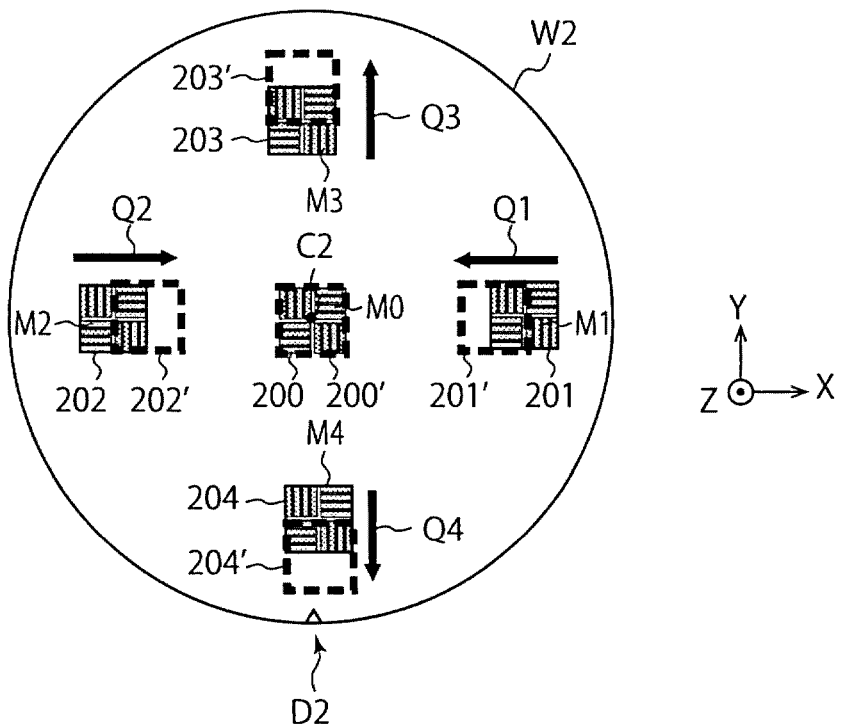

FIGS. 10A and 10B are plan views illustrating details of the bonding method according to the first embodiment. FIGS. 10A and 10B illustrate structures of the array wafer W1 and the circuit wafer W2 before bonding in plan views, respectively.

FIG. 10A illustrates the array wafer W1 in which the warpage is generated by forming the memory cell array 11, the insulating film 12, the interlayer insulating film 13, and the like on the substrate 16. The array wafer W1 illustrated in FIG. 10A is the same as the array wafer W1 illustrated FIG. 9. FIG. 10A illustrates the deviation between the designed position of each of the various regions on the surface of the array wafer W1 and the actual position thereof. In FIG. 10A, positions of the regions 100 to 104 are shifted to positions of regions 100' to 104' due to the warpage generated in the array wafer W1. The positions of the regions 100 to 104 correspond to the designed positions and the positions of the regions 100' to 104' correspond to the actual positions. For example, the metal pads 41 provided in the region 101 in design are actually provided in the region 101'. Shapes of the regions 100' to 104' are often changed from shapes of the regions 100 to 104 due to the warpage.

Arrows P1 to P4 illustrated in FIG. 10A indicate deviations between the positions of the regions 101 to 104 and the positions of the regions 101' to 104', respectively. The region 101' is shifted to the −X direction with respect to the region 101. The region 102' is shifted to the +X direction with respect to the region 102. The region 103' is shifted to the +Y direction with respect to the region 103. The region 104' is shifted to the −Y direction with respect to the region 104. Owing to this, the positions of the regions 101' to 104' are shifted in the direction of being closer to the center C1 with respect to the positions of the regions 101 to 104 for the position along the X direction, and are shifted in the direction of being farther from the center C1 with respect to the positions of the regions 101 to 104 for the position along the Y direction. Meanwhile, the position of the region 100' coincides with the position of the region 100. In the present embodiment, such positional deviations are generated due to the warpage of the array wafer W1.

FIG. 10B illustrates the circuit wafer W2 at a time of forming alignment marks M0 to M4 on the substrate 15. In the present embodiment, a plurality of recessed parts are formed in the substrate 15, the alignment marks M0 to M4 are buried in these recessed parts, and the transistors 31 and the interlayer insulating film 14 are then formed on the substrate 15 via the alignment marks M0 to M4 (FIG. 3). At this time, the position of each of the various structures in the circuit wafer W2 is set with reference to the position of any of the alignment marks M0 to M4. Examples of these structures include the gate electrodes 32 of the transistors 31, the contact plugs 33, and the metal pads 38. The alignment marks M0 to M4 are, for example, metal patterns formed from a metal. The alignment marks M0 to M4 are an example of a predetermined pattern.

In at least one embodiment, to deal with the warpage of the array wafer W1, positions of the alignment marks M0 to M4 are shifted at the time of forming the alignment marks M0 to M4. FIG. 10B illustrates a state in which the positions of the alignment marks M0 to M4 are shifted from positions in the regions 200 to 204 to positions in the regions 200' to 204', respectively. Therefore, the positions in the regions 200 to 204 correspond to designed positions of the alignment marks M0 to M4 before the positions of the alignment marks M0 to M4 are shifted. Meanwhile, the positions in the regions 200' to 204' correspond to actual positions of the alignment marks M0 to M4 after the positions of the alignment marks M0 to M4 are shifted. Shapes of the regions 200' to 204' may be changed from shapes of the regions 200 to 204. Such positional corrections of the alignment marks M0 to M4 can be achieved by, for example, correcting (changing) exposure positions in the exposure process at the time of forming openings for the alignment marks M0 to M4 in the substrate 15.

Arrows Q1 to Q4 illustrated in FIG. 10B indicate the deviations between the positions of the regions 201 to 204 and the positions of the regions 201' to 204', respectively. The region 201' is shifted to the −X direction with respect to the region 201. The region 202' is shifted to the +X direction with respect to the region 202. The region 203' is shifted to the +Y direction with respect to the region 203. The region 204' is shifted to the −Y direction with respect to the region 204. Owing to this, the positions of the regions 201' to 204' are shifted in the direction of being closer to the center C2 with respect to the positions of the regions 201 to 204 for the position along the X direction, and are shifted in the direction of being farther from the center C2 with respect to the positions of the regions 201 to 204 for the position along the Y direction. Meanwhile, the position of the region 200' coincides with the position of the region 200. In this way, the positional corrections of the regions 200 to 204 in at least one embodiment are performed in the same direction as the positional deviations of the regions 100 to 104 corresponding to the regions 200 to 204. The positions of the alignment marks M0 to M4 of the circuit wafer W2 can be thereby corrected in the direction of reducing the influence of the warpage of the array wafer W1.

As described above, the position of each of the various structures in the circuit wafer W2 is set with reference to the position of any of the alignment marks M0 to M4. Owing to this, when the positions of the alignment marks M0 to M4 are corrected, the positions of these structures as corrected, as well. It is thereby possible to bond the array wafer W1 and the circuit wafer W2 together so that the metal pads 41 adjoin the metal pads 38 (FIG. 4) even with the warpage generated in the array wafer W1.

While FIG. 10B illustrates the five alignment marks M0 to M4, the number of alignment marks in the circuit wafer W2 may be other than five. The alignment marks are disposed, for example, in the scribe regions B2 of the circuit wafer W2 (refer to FIG. 5B and the like).

Furthermore, the warpage described above may be generated in the circuit wafer W2 as an alternative to the array wafer W1 or may be generated in both the array wafer W1 and the circuit wafer W2. The array wafer W1 contains more metal layers than the circuit wafer W2 in the semiconductor device according to at least one embodiment. Therefore, the array wafer W1 tends to more largely warp than the circuit wafer W2. Moreover, the positional corrections of the alignment marks may be applied to alignment marks of the array wafer W1 as an alternative to the alignment marks of the circuit wafer W2, or may be applied to the alignment marks of both the array wafer W1 and the circuit wafer W2. Furthermore, the positional corrections of the alignment marks in the present embodiment may be applied when three or more wafers are bonded together.

The positional corrections of the alignment marks M0 to M4 will now be described in more detail.

In the present embodiment, a plurality of array wafers W1 and a plurality of circuit wafers W2 are manufactured (FIG. 3), and one of these array wafers W1 is bonded to one of these circuit wafers W2 (FIG. 4). As a result, one bonded wafer including one array wafer W1 and one circuit wafer W2 is manufactured. In the present embodiment, by repeating such bonding a plurality of times, it is possible to manufacture a plurality of bonded wafers.

In at least one embodiment, at a time of manufacturing N, where N is an integer equal to or greater than two, bonded wafers, one array wafer W1 is manufactured first and the warpage of this array wafer W1 is then measured. Next, (N−1) array wafers W1 and N circuit wafers W2 are manufactured. At this time, the positions of the alignment marks M0 to M4 of each circuit wafer W2 are corrected on the basis of a measurement result of the warpage. It is thereby possible to bond the array wafer W1 and the circuit wafer W2 to be provided in each bonded wafer together so that the metal pads 41 adjoin the metal pads 38.

In this way, in at least one embodiment, at the time of manufacturing the N bonded wafers, the warpage of only one array wafer W1 is measured without measuring all the warpage of the N array wafers W1. This is because these array wafers W1 are identical in structure and the warpage of these array wafers W1 is expected to be the same in state. It is thereby possible to lessen a burden of measuring the warpage. The array wafer W1 subjected to the measurement of the warpage may be either a wafer that is actually used in manufacturing the bonded wafers or a wafer that is not actually used in manufacturing the bonded wafers.

In this way, in a case of manufacturing one array wafer W1 and one circuit wafer W2 and bonding the array wafer W1 with the circuit wafer W2, the warpage may be measured either from this array wafer W1 or from another wafer (array wafer W1) identical in structure to this array wafer W1. In this case, the positions of the alignment marks M0 to M4 of this circuit wafer W2 may be corrected on the basis of the measurement result of the former warpage or on the basis of the measurement result of the latter warpage.

Whether the positions of the alignment marks M0 to M4 are corrected can be determined by preparing, for example, data about the designed positions of the alignment marks M0 to M4, measuring the actual positions of the alignment marks M0 to M4, and comparing the prepared data with the measurement result. Alternatively, when the positions of the designed positions of the four alignment marks M1 to M4 are equidistant from the center C2, it is possible to determine whether the positions of the alignment marks M1 to M4 are corrected by measuring whether the actual positions of the four alignment marks M1 to M4 are equidistant from the center C2.

FIGS. 11A, 11B, 12A, and 12B are cross-sectional views illustrating a method of manufacturing the semiconductor device according to the first embodiment. The present method corresponds to an example of a method of manufacturing the circuit wafer W2 illustrated in FIG. 3.

Figure 11A:
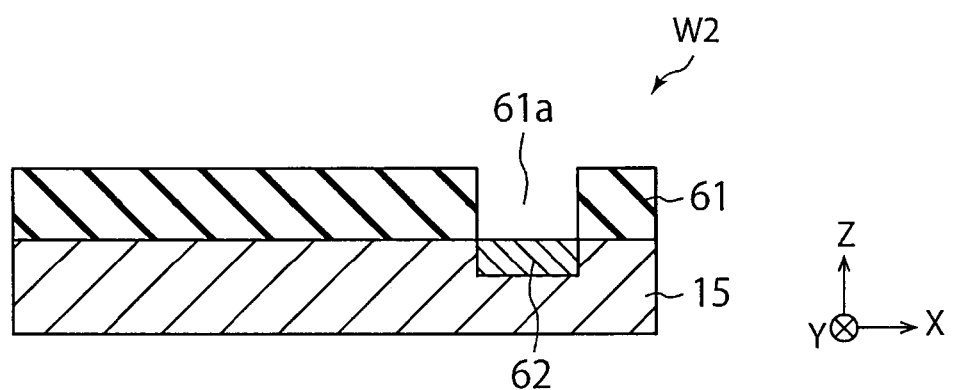
FIGS. 11A and 11B are cross-sectional views (1/2) illustrating a method of manufacturing the semiconductor device according to the first embodiment.

First, a resist film 61 is formed on the substrate 15, and an opening 61a is formed in the resist film 61 by lithography and etching (FIG. 11A). As a result, an upper surface of the substrate 15 is exposed into the opening 61a.

Next, with the resist film 61 used as a mask, an alignment mark 62 is formed in the substrate 15 from the opening 61a (FIG. 11A). The alignment mark 62 is formed by, for example, forming an opening in the substrate 15 by RIE (Reactive Ion Etching) and burying the alignment mark 62 in this opening. In this case, the resist film 61 may be removed before the alignment mark 62 is buried. The alignment mark 62 corresponds to any of the alignment marks M0 to M4 described above. The alignment mark 62 is, for example, a metal layer such as an Al (aluminum) layer, a W (tungsten) layer, or a Cu (copper) layer.

The alignment mark 62 in at least one embodiment is formed by the method described with reference to FIG. 10B. For example, a formation position of the opening 61a during lithography, i.e., an exposure position is corrected on the basis of the measurement result of the warpage of the array wafer W1. A position of the opening in the substrate 15 is thereby corrected, and as a result of the correction, the position of the alignment mark 62 is corrected.

Figure 11B:
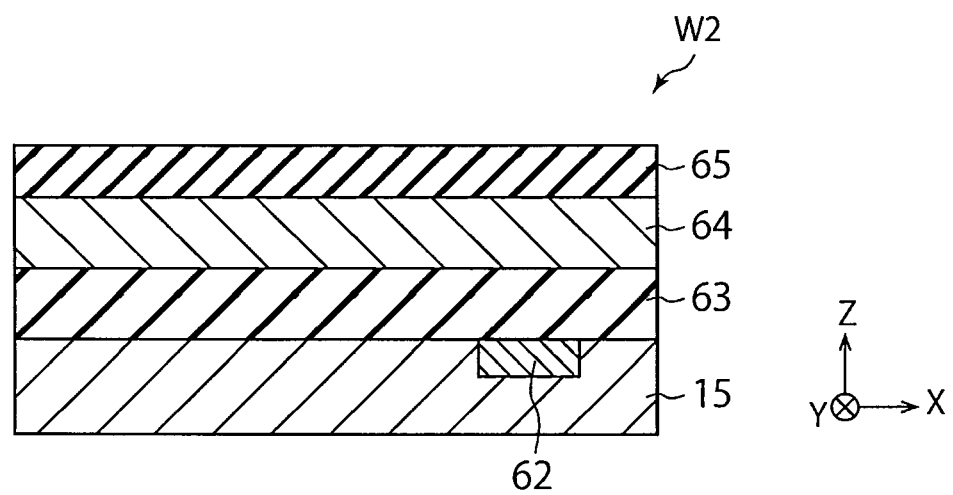

Next, after removal of the resist film 61, a foundation layer 63, a to-be-processed layer 64, and a resist film 65 are formed on the substrate 15 and the alignment mark 62 in sequence (FIG. 11B). The to-be-processed layer 64 is, for example, a metal layer for the contact plugs 33, any of the interconnection layers 34 to 36, a metal layer for the via plugs 37, or a metal layer for the metal pads 38.

Figure 12A:
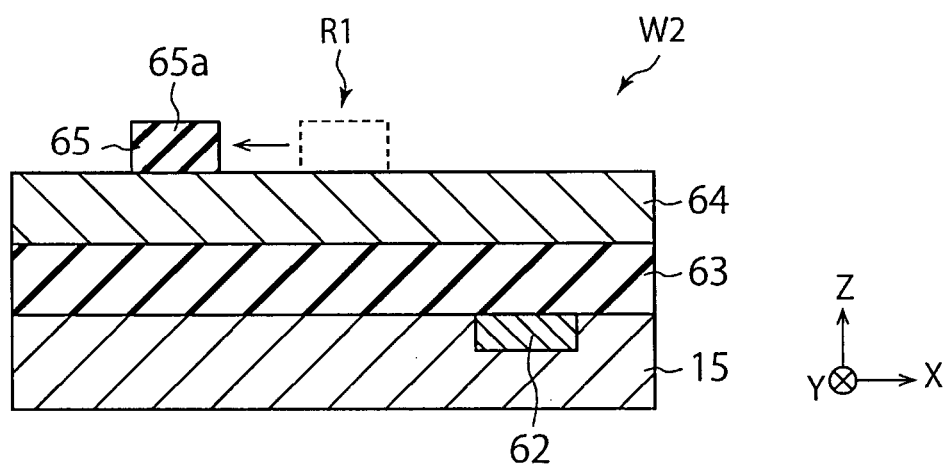
FIGS. 12A and 12B are cross-sectional views (2/2) illustrating the method of manufacturing the semiconductor device according to the first embodiment.

Next, the resist film 65 is patterned by lithography and etching (FIG. 12A). As a result, a pattern (resist pattern) 65a is formed from the resist film 65. FIG. 12A illustrates a state in which a position of the pattern 65a is changed from a position of a reference sign R1 as a result of the positional correction of the alignment mark 62.

Figure 12B:
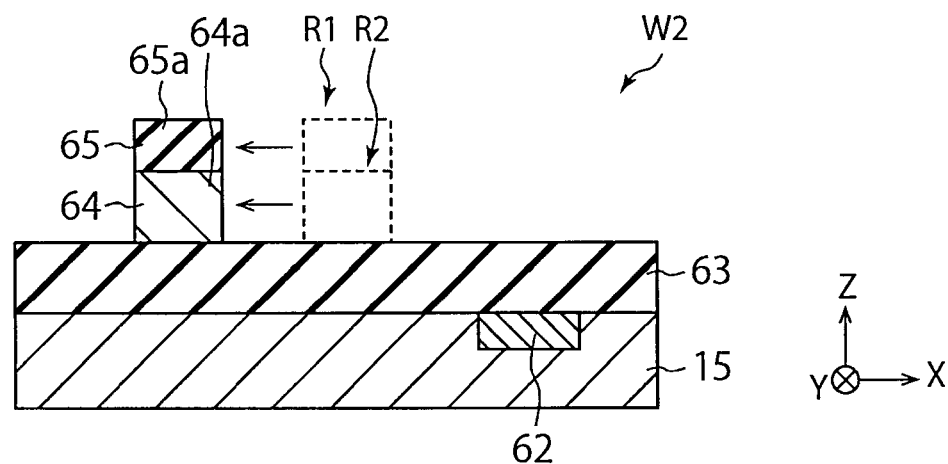

Next, the to-be-processed layer 64 is processed by RIE using the resist film 65 as a mask (FIG. 11B). As a result, a pattern 64a is formed from the to-be-processed layer 64. The pattern 64a is, for example, the contact plugs 33, the interconnections in the interconnection layers 34 to 36, the via plugs 37, or the metal pads 38. FIG. 12B illustrates a state in which a position of the pattern 64a is changed from a position of a reference sign R2 as a result of a positional correction of the pattern 65a. Subsequently, the resist film 65 is removed.

In this way, the circuit wafer W2 according to the present embodiment is manufactured. Subsequently, the semiconductor device according to the present embodiment is manufactured by bonding the array wafer W1 with the circuit wafer W2 (FIG. 4).

As described so far, at the time of forming the alignment marks M0 to M4 (62) of the circuit wafer W2 according to at least one embodiment, the positions of the alignment marks M0 to M4 are changed in the direction of being closer to the center C2 for the position along the X direction and changed in the direction of being farther from the center C2 for the position along the Y direction. Therefore, according to at least one embodiment, it is possible to appropriately bond the array wafer W1 with the circuit wafer W2 even when the array wafer W1 has the warpage as illustrated in FIG. 9.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of manufacturing a semiconductor device comprising:

forming a first metal pad in each of a plurality of first regions on a first substrate so that warpage is generated on the first substrate;

forming a predetermined pattern in each of a plurality of second regions on a second substrate;

forming a second metal pad in each of the plurality of second regions; and bonding, after forming the first metal pad and the second metal pad, the first substrate with the second substrate so that the first metal pad is opposed to the second metal pad, wherein the method further comprising making a correction, at a time of forming the predetermined pattern in each of the plurality of second regions on the second substrate, (i) to change a position of the predetermined pattern in each of the plurality of second regions in a direction closer to a center of the second substrate along a first direction, and (ii) to change the position of the predetermined pattern in a direction farther from the center of the second substrate along a second direction.

2. The method of manufacturing the semiconductor device according to claim 1, further comprising
forming a first film, including the first metal pad, on the first substrate; and
forming a second film, including the second metal pad, on the second substrate before bonding the first substrate with the second substrate.

3. The method of manufacturing the semiconductor device according to claim 2, wherein
the first film includes a memory cell array, and the second film includes a circuit configured to control the memory cell array.

4. The method of manufacturing the semiconductor device according to claim 1, wherein
the warpage of the first substrate is generated so that a direction of the warpage in a cross-section along the first direction is opposite to a direction of the warpage in a cross-section along the second direction.

5. The method of manufacturing the semiconductor device according to claim 1, wherein
the first direction and the second direction are parallel to a surface of the second substrate and are perpendicular to each other.

6. The method of manufacturing the semiconductor device according to claim 1, wherein
the predetermined pattern is formed in the second substrate.

7. The method of manufacturing the semiconductor device according to claim 1, wherein
the predetermined pattern is formed from a metal.

8. The method of manufacturing the semiconductor device according to claim 1, wherein
the predetermined pattern is an alignment mark.

9. The method of manufacturing the semiconductor device according to claim 8, wherein
a position of the second metal pad is set with reference to a position of the alignment mark.

10. The method of manufacturing the semiconductor device according to claim 1, further comprising correcting
a position of the predetermined pattern on the basis of a measurement result of the warpage of the first substrate.

11. The method of manufacturing the semiconductor device according to claim 1, further comprising: correcting a position of the predetermined pattern based on a measured warpage of a different substrate which differs from the first substrate and on which the same type of film as the first film is formed.

12. The method of manufacturing the semiconductor device according to claim 1, wherein the first metal pad includes copper.

13. The method of manufacturing the semiconductor device according to claim 1, wherein the bonding the first substrate with the second substrate includes annealing the first substrate and the second substrate.

14. The method of manufacturing the semiconductor device according to claim 3, wherein the memory cell array includes a plurality of word lines.

15. The method of manufacturing the semiconductor device according to claim 8, wherein the alignment mark is buried in the second substrate.

16. The method of manufacturing the semiconductor device according to claim 8, wherein the alignment mark includes metal.

* * * * *